(12) United States Patent
Ohtani

(10) Patent No.: US 7,898,166 B2
(45) Date of Patent: Mar. 1, 2011

(54) LIGHT EMITTING DEVICE EMITTING FOUR SPECIFIC COLORS

(75) Inventor: Hisashi Ohtani, Tochigi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 225 days.

(21) Appl. No.: 12/236,545

(22) Filed: Sep. 24, 2008

(65) Prior Publication Data

US 2009/0033230 A1    Feb. 5, 2009

Related U.S. Application Data

(63) Continuation of application No. 10/994,269, filed on Nov. 23, 2004, now Pat. No. 7,439,667.

(30) Foreign Application Priority Data

Dec. 12, 2003    (JP) .................................. 2003-415173

(51) Int. Cl.
*H01L 51/00* (2006.01)
*G09G 5/02* (2006.01)

(52) U.S. Cl. ......................................... 313/500; 313/506
(58) Field of Classification Search .................. 313/500, 313/504, 506; 345/694, 690
See application file for complete search history.

(56) References Cited

U.S. PATENT DOCUMENTS

| | | | |
|---|---|---|---|
| 5,621,284 A | 4/1997 | Shichao |
| 5,966,189 A | 10/1999 | Matsuo |
| 5,986,628 A | 11/1999 | Tuenge |
| 6,121,726 A | 9/2000 | Codama |
| 6,275,274 B1 | 8/2001 | Kanemori |
| 6,326,981 B1 | 12/2001 | Mori |
| 6,366,025 B1 | 4/2002 | Yamada |
| 6,414,439 B1 | 7/2002 | Tuenge |
| 6,466,135 B1 | 10/2002 | Srivastava |
| 6,570,584 B1 | 5/2003 | Cok |
| 6,614,498 B1 | 9/2003 | Tanaka |

(Continued)

FOREIGN PATENT DOCUMENTS

CN    1381821    11/2002

(Continued)

OTHER PUBLICATIONS

Office Action issued on Mar. 28, 2008, in co-pending Chinese Office Action 200410103782.8, with full translation.

(Continued)

*Primary Examiner* — Karabi Guharay
(74) *Attorney, Agent, or Firm* — Fish & Richardson P.C.

(57) ABSTRACT

It is an object of the invention to provide a light emitting device in which burden on a light emitting element having low luminous efficiency is relieved, and the deterioration of a light emitting element, the reduction in color reproduction due to the deteriorated light emitting element, and increase in electric power consumption can be suppressed. A light emitting device according to the invention has light emitting elements each of which emits one of colors corresponding to three primary colors. Further, one feature of the light emitting device according to the invention has a light emitting element which emits a neutral color. The light emitting device according to the invention has a structure in which a plurality of pixels having light emitting elements each of which emits one of colors corresponding to three primary colors, and a light emitting element which emits a neutral color as one group, are arranged.

12 Claims, 14 Drawing Sheets

U.S. PATENT DOCUMENTS

| | | |
|---|---|---|
| 6,660,332 B2 | 12/2003 | Kawase |
| 6,856,087 B2 | 2/2005 | Lin |
| 6,867,549 B2 | 3/2005 | Cok |
| 6,888,604 B2 | 5/2005 | Rho |
| 6,914,649 B2 | 7/2005 | Liu |
| 6,919,681 B2 | 7/2005 | Cok |
| 6,930,328 B2 | 8/2005 | Kimura |
| 6,989,876 B2 | 1/2006 | Song |
| 7,027,013 B2 | 4/2006 | Ouellete |
| 7,129,634 B2 | 10/2006 | Boroson |
| 7,439,667 B2 * | 10/2008 | Ohtani ............ 313/500 |
| 2002/0122049 A1 | 9/2002 | Freidhoff |
| 2002/0167268 A1 | 11/2002 | Aruga |
| 2003/0189410 A1 | 10/2003 | Yamazaki |
| 2004/0051724 A1 | 3/2004 | Elliott |
| 2005/0001542 A1 | 1/2005 | Kiguchi |
| 2005/0057172 A1 | 3/2005 | Su |
| 2005/0127819 A1 | 6/2005 | Ohtani |
| 2005/0151462 A1 | 7/2005 | Miyagawa |
| 2005/0162600 A1 | 7/2005 | Rho |
| 2006/0033422 A1 | 2/2006 | Chao |
| 2006/0081844 A1 | 4/2006 | Hirosue |
| 2006/0087227 A1 | 4/2006 | Yamanaka |
| 2006/0214566 A1 | 9/2006 | Moriyama |
| 2006/0267889 A1 | 11/2006 | Kumura |

FOREIGN PATENT DOCUMENTS

| | | |
|---|---|---|
| EP | 1239447 | 9/2002 |
| JP | 2000-068053 | 3/2000 |
| JP | 2001-306023 | 11/2001 |
| JP | 2002-299062 | 10/2002 |
| JP | 2004-004822 | 1/2004 |
| WO | WO 2004/017129 | 2/2004 |

OTHER PUBLICATIONS

Sony Press Releases: "Realization of Natural Color Reproduction in Digital Still Cameras, Closer to the Natural Sight Perception of the Human Eye," Jul. 16, 2003, reprinted from http://www.sony.net/SonyInfo/News/Press_Archive/200307/03-029E/ on Apr. 5, 2007.

Wu, C., et al., "Improving the Image Quality of a Liquid-Crystal Projector by Diffractive Gratings," *SID Digest '98: SID International Symposium Digest of Technical Papers*, P-56, May 1998, pp. 671-674.

Zhang, B., et al., "Three-Dimensional Optical Analyses of Fringing Effect in Small Color Pixels," *SID Digest '05: SID International Symposium Digest of Technical Papers*, vol. 36, Book 2, May 2005, pp. 1302-1305.

* cited by examiner

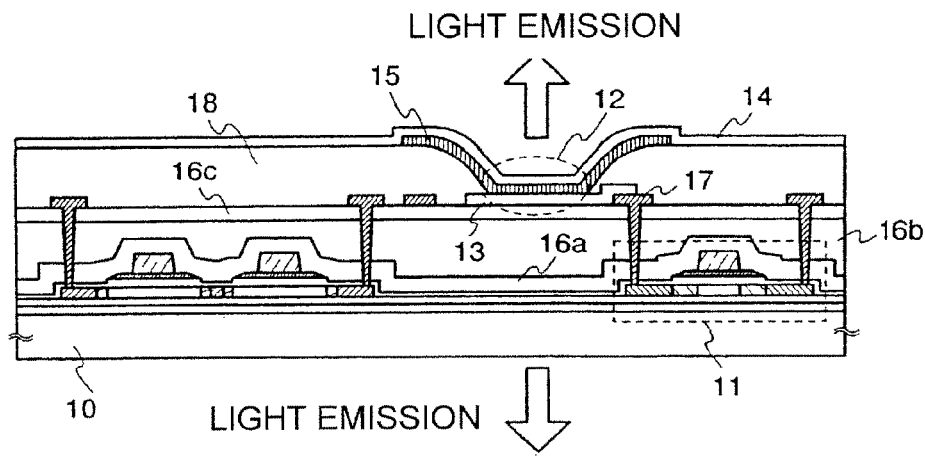
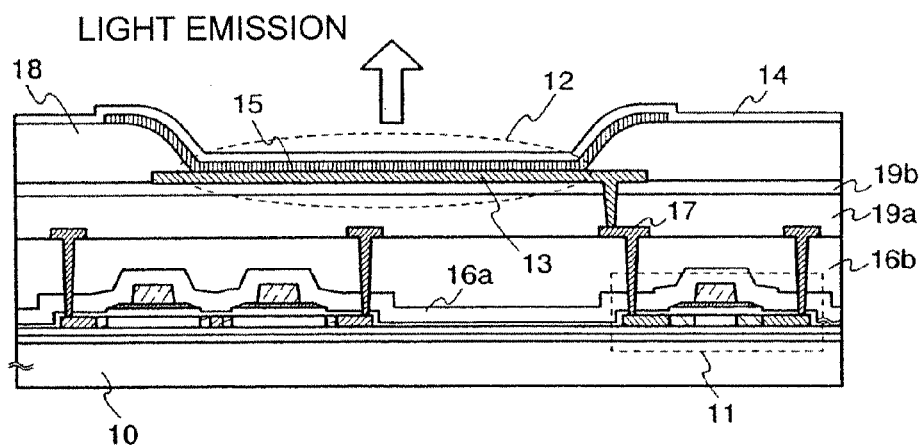
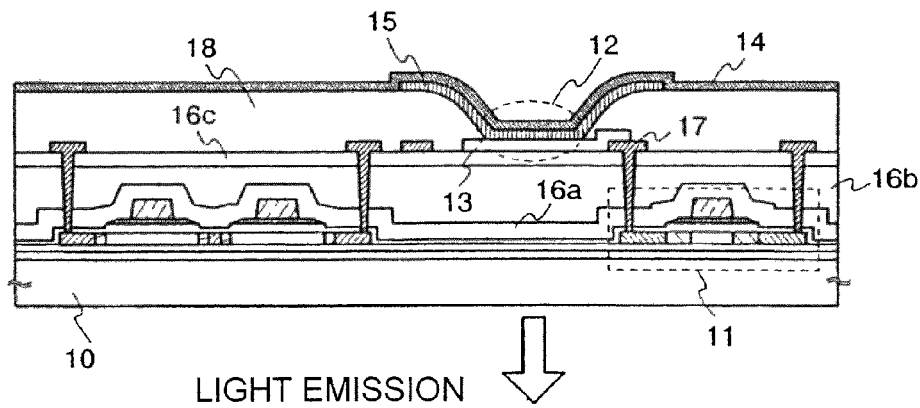

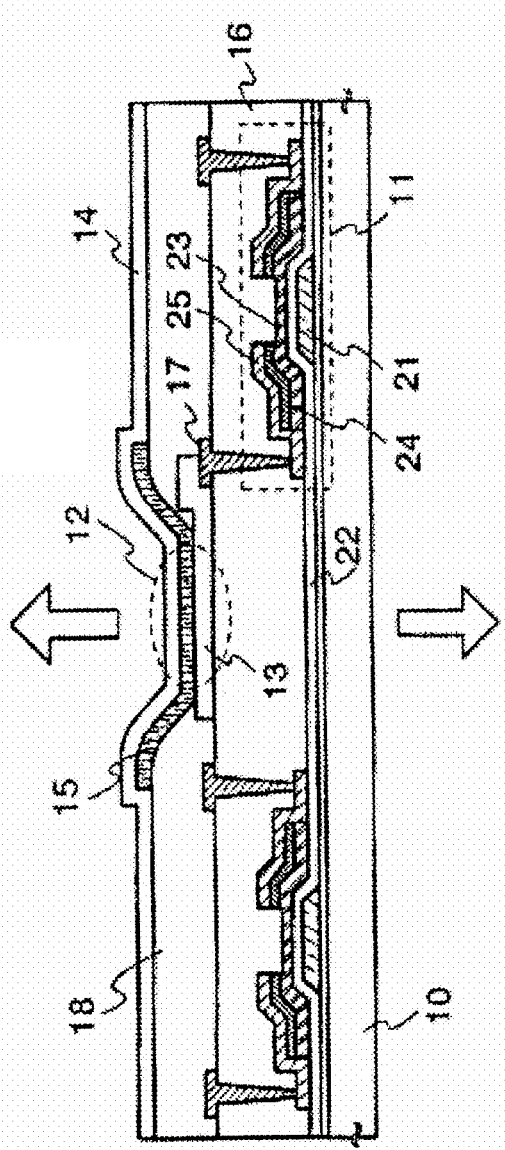
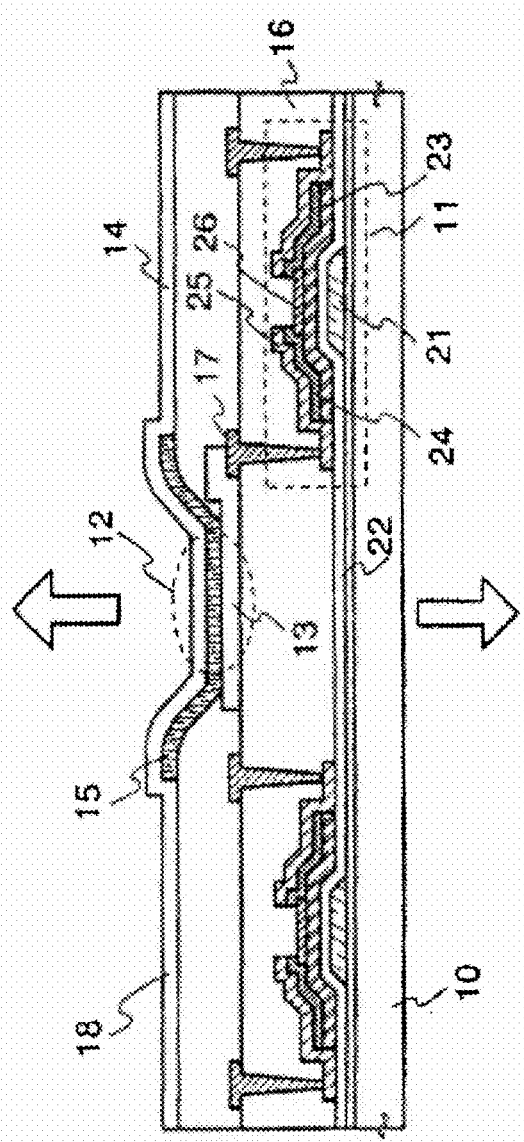
FIG. 9A
FIG. 9B

LIGHT EMITTING DEVICE EMITTING FOUR SPECIFIC COLORS

CROSS-REFERENCE TO RELATED APPLICATIONS

This application is a continuation of U.S. application Ser. No. 10/994,269, filed Nov. 23, 2004, now pending, which claims the benefit of a foreign priority application filed in Japan as Serial No. 2003-415173 on Dec. 12, 2003, both of which are incorporated by reference.

BACKGROUND OF THE INVENTION

1. Field of the Invention

The present invention relates to a light emitting device, in particular, to a light emitting device which can display an image which includes multicolors by combining light emission having different colors.

2. Description of the Related Art

A light emitting device utilizing light emitted from an electroluminescence element (a light emitting element) is a device which highly draws attention as a display device having wide view angles and low power consumption.

In recent years, in a field of developing a light emitting device, the research and development of a light emitting device capable of displaying a high quality full color image has been accelerated to ensure the market of display devices and the like for various information processing devices such as a television receiver or a car navigation system.

In order to display a full color image, it is required that regions emitting light emission of three primary colors of red (R), green (G) and blue (B) are independently provided so as to control brightness of color and chromaticity to be indicated by changing light emission time and light emission brightness in each region.

As a method for changing brightness of color and chromaticity, there is a method for changing the brightness of color and chromaticity by changing light emission time of a light emitting element, and a method for changing the brightness of color and chromaticity by changing brightness of a light emitting element. In the case of employing the former method, brightness of color and chromaticity are changed by variously combining each light emission of red, green and blue by changing light emitting time according to each luminescent color.

Meanwhile, luminous efficiency of a light emitting element differs according to a luminous body included in the light emitting element and characteristics of other substances. In a light emitting device, luminous efficiency differs in each light emitting element which indicates each luminous color. Accordingly, more current is relatively required in a light emitting element having lower luminous efficiency to obtain light emission having desired brightness.

Furthermore, the human eye has different sensitivity to each emission wavelength, and generally has higher sensitivity to the emission wavelength of green than that of red or blue. Hence, it is required to make brightness of blue and red relatively higher than that of green so that blue and red emit light to which human eye has the same sensitivity as green.

Flowing a lot of current to a light emitting element to increase brightness of the light emitting element make the light emitting element promotes the deterioration of the light emitting element, and leads to increase in electric power consumption of a display device. What is more, when emission wavelength shifts due to a deteriorated light emitting element, color reproduction of a light emitting device decreases and thus sometimes image quality is deteriorated. Therefore, the development of a luminous body or a light emitting element which can emit light efficiently and has longer life has been attempted. For example, in Reference 1 (Japanese Patent Laid-Open No. Hei 2002-299062), it is contrived device to enhance luminous efficiency by adjusting light path length is carried out.

BRIEF SUMMARY OF THE INVENTION

It is an object of the invention to provide a light emitting device in which burden on a light emitting element having low luminous efficiency is relieved, and the deterioration of a light emitting element, the deterioration of color reproduction due to the deteriorated light emitting element, and increase in electric power consumption can be suppressed.

A light emitting device according to the invention has light emitting elements each of which emits one of colors corresponding to three primary colors. Further, one feature of the light emitting device according to the invention has a light emitting element which emits a neutral color. The light emitting device according to the invention has a structure in which a plurality of pixels having light emitting elements each of which emits one of colors corresponding to three primary colors, and a light emitting element which emits a neutral color as one group, are arranged.

In each pixel, a plurality of colors having different brightness of color and chromaticity are displayed by changing and combining light emitting time or brightness of light emission from each light emitting element included in the pixel. Note that at least one light emitting element which emits a neutral color may be included at in one pixel.

Three primary colors are three colors of red, green and blue. Hereupon, red means a color having coordinates in the region where x in a chromaticity diagram is 0.6 or more, and y is 0.35 or less, when it is indicated by a CIE-XYZ color system. Further, green means a color having coordinates in the region where x in a chromaticity diagram is 0.3 or less, and y is 0.6 or more, when it is indicated by a CEE-XYZ color system. Moreover, blue means a color having coordinates in the region where x in a chromaticity diagram is 0.15 or less, and y is 0.2 or less, when it is indicated by a CIE-XYZ color system. Note that the CIE-XYZ color system is a color system based on three stimulation values X, Y and Z. The chromaticity diagram is a diagram which indicates colors with x-y coordinate space based on three stimulation values X, Y and Z. Note that chromaticity numerically limits color types of light except for brightness.

A neutral color means a color having coordinates in a region which is different from above-mentioned regions indicating red, green and blue in the chromaticity diagram, when it is shown with the CIE-XYZ color system.

A light emitting element which emits a neutral color plays an auxiliary role with respect to a light emitting element having low luminous efficiency, when, a neutral color is indicated by combining light emission of a tight emitting element having higher luminous efficiency and light emission of the light emitting element having low luminous efficiency. Accordingly, in a light emitting element having low luminous efficiency, a burden on light emission is relieved since brightness required for display can be reduced compared with the case of displaying a neutral color by combining the three primary colors. Thus, the life of a light emitting element having low luminous efficiency can be particularly extended. As a result, the deterioration of a light emitting element or the reduction image quality caused by the deteriorated light emitting element can be suppressed. Further, more colors can be indicated by providing a light emitting element which emits a neutral color, therefore, the range of color reproduction range of a light emitting device is widened.

The invention relieves the burden on a light emitting element having low luminous efficiency or a light emitting element of a luminescent color to which the human eye has lower sensitivity. Accordingly, deterioration of the light emitting element or the reduction in image quality due to the deteriorated tight emitting element can be suppressed. Moreover, the light emitting device which can indicate more colors resulting in expanding color reproduction range can be obtained.

BRIEF DESCRIPTION OF THE DRAWING

FIGS. 8A to 8C are views illustrating cross-sectional structures of a light emitting device to which a certain aspect of the invention is applied;

FIGS. 9A and 9B are views illustrating cross-sectional structures of a light emitting device to which a certain aspect of the invention is applied;

DETAILED DESCRIPTION OF THE INVENTION

Embodiment Mode

Figure 14:
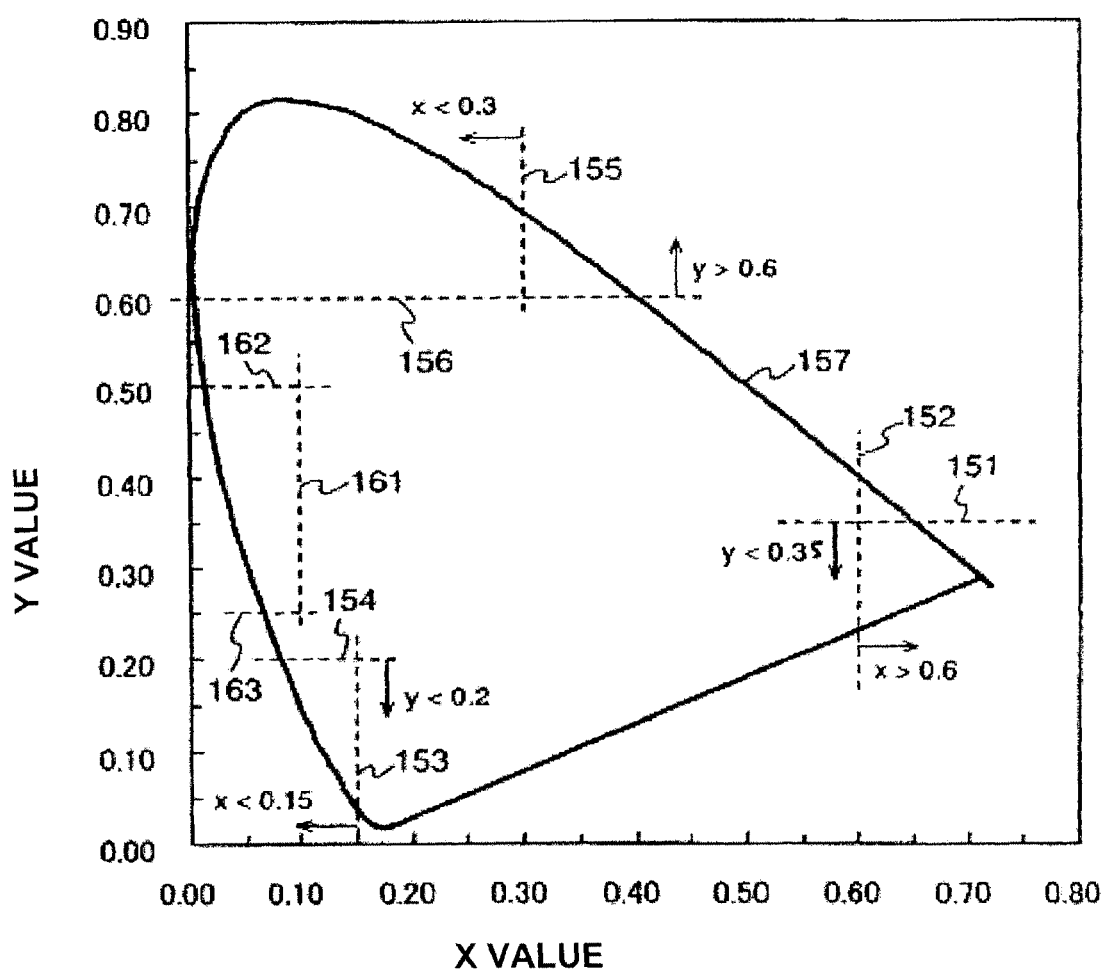
FIG. 14 is a figure illustrating colors with x-y coordinates space based on three stimulation values X, Y and Z.

One aspect of a light emitting device according to the present invention is described with reference to FIGS. 1, 2 and 14. FIG. 14 is a chromaticity diagram which indicates colons with x-y coordinate space based on three stimulation values X, Y and Z.

A light emitting device according to the invention includes a first light emitting element 101 which emits red light, a second light emitting element 102 which emits green light, a third light emitting element 103 which emits blue light, and a fourth light emitting element 104 which emits blue-tinged green light Note that a luminescent color of the fourth light emitting element is not limited to the above-mentioned luminescent colors and it may be, for example, red-purple, yellow-orange or the like.

Hereupon, red means a color having coordinates in a region where x in a chromaticity diagram is 0.6 or more and y is 0.35 or less (a region surrounded by the periphery of the chromaticity diagram, and dotted lines 151 and 152 in FIG. 14), when red is indicated by a CIE-XYZ color system. Green means a color having coordinates in a region where x in a chromaticity diagram is 0.3 or less and y is 0.6 or more (a region surrounded by the periphery of the chromaticity diagram, and dotted lines 155 and 156 in FIG. 14), when green is indicated by a CIE-XYZ color system. Blue means a color having coordinates in a region where x in a chromaticity diagram is 0.15 or less and y is 0.2 or less (a region surrounded by the periphery of the chromaticity diagram, and dotted lines 153 and 154 in FIG. 14), when blue is indicated by a CIE-XYZ color system. Additionally, a neutral color between green and blue means a color having coordinates in a region where x in a chromaticity diagram is 0.1 or less and y is 0.25 or more and 0.5 or less (a region surrounded by the periphery of the chromaticity diagram, and dotted lines 161, 162 and 163 in FIG. 14), when the neutral color between green and blue is indicated by a CIE-XYZ color system. Preferably, it is a color which has coordinates in a region where x in a chromaticity diagram is 0.1 or less and y is from 0.35 or more and to 0.45 or less.

Figure 1:
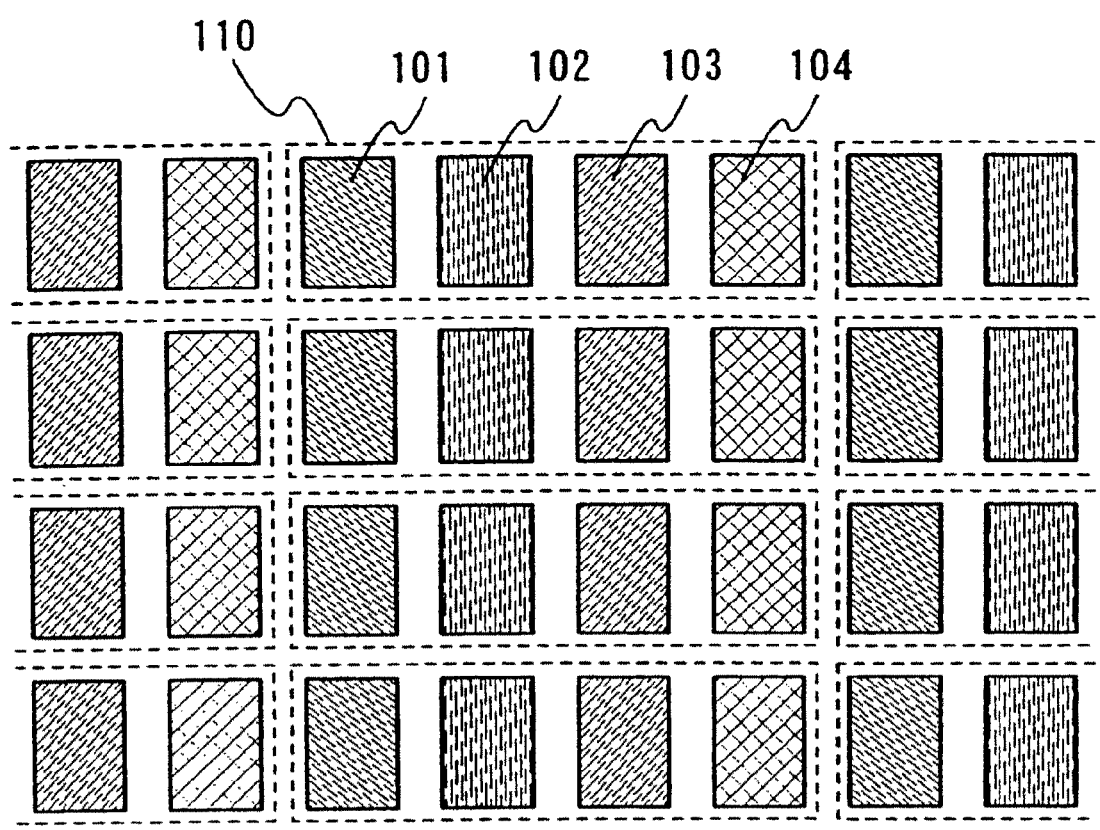
FIG. 1 is a diagram illustrating a pixel provided for a tight emitting device according to a certain aspect of the present invention, and the arrangement of light emitting elements which constitute the pixel.

As shown in FIG. 1, a plurality of pixels 110 in which the first light emitting element 101, the second light emitting element 102, the third light emitting element 103 and the fourth light emitting element 104 are in one group, are arranged.

In FIG. 1, the first light emitting element 101 to the fourth light emitting element 104 are arranged in rows. However, the way of arranging the light emitting elements is not particularly limited. For example, the light emitting elements may be arranged in columns, or may be arranged so that the light emitting element which emits red light is adjacent to the light emitting element which emits blue light. Further, the shape of each light emitting element is not limited to a rectangle shown in FIG. 1, and for example, it may be a square, another polygon or a shape having curvature.

Figure 2:
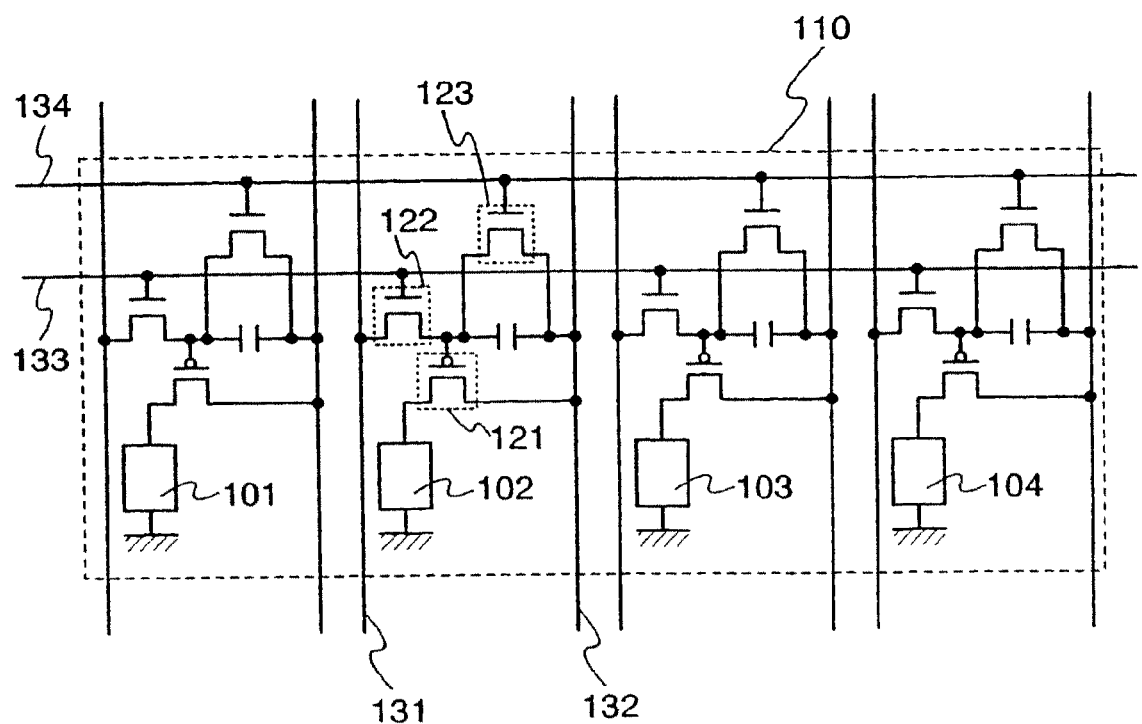
FIG. 2 is a diagram illustrating light emitting elements provided for a light emitting device according to a certain aspect of the invention and circuits for driving the light emitting elements.

As shown in FIG. 2, circuits to drive each of the first light emitting element 101 to the fourth light emitting element 104 is connected the first light emitting element 101 to the fourth light emitting element 104.

The circuits connected to each light emitting element includes a driving transistor 121 that determines a light-emitting or non-light-emitting state of the light emitting element in accordance with an image signal, a switching transistor 122 that controls an input of the image signal, an erasing transistor 123 that controls the light emitting element to be a non-light-emitting state regardless of the image signal, a source signal line 131, a current supply line 132, a first scanning line 133 and a second scanning line 134.

Here, a driving method when the second light emitting element 102 emits light is described. When the first scanning line 133 is selected in a writing period, the switching transistor 122 that has a gate connected to the first scanning line 133 is turned on. Then, when an image signal inputted to the source signal line 131 is inputted to a gate of the driving transistor 121 through the switching transistor 122, current flows from the current supply line 132 to the second light emitting element 102 to emit green light. At this time, light emission brightness is determined in accordance with the current value flowing to the second light emitting element 102.

The first light emitting element 101, the third light emitting element 103 and the fourth light emitting element 104 are also driven in the same manner as the second light emitting element 102. Thus, light emitting time of each light emitting element is separately controlled by the circuits connected to each light emitting element; therefore, a desired display color can be obtained. Hereupon, the display color means a color in which light emission obtained from a plurality of light emitting elements, which are included in a pixel and each of which has a different luminescent color, is combined and visually mixed.

Note that a driving method is not limited to the method shown in this embodiment mode, and a digital driving method other than the above-mentioned driving method may be employed. Additionally, the circuits may be operated by an analog driving method.

There is also no limit to an element structure of each transistor, and either a stagger type or an inverse stagger type may be used. In addition, either a single gate structure or a multigate structure may be used. Further, an LDD (Lightly Doped Drain) structure, a single drain structure or the like may be used.

In the light emitting device described above, blue-tinged green, namely, the fourth light emitting element 104 which emits a neutral color between blue and green plays an auxiliary role with respect to a light emitting element having low luminous efficiency, when, for example, luminous efficiency of the second light emitting element 102 and the third light emitting element 103 are different in the case of displaying a neutral color by combining light emission from each light emitting element. Accordingly, a burden on an element having low luminous efficiency is relieved, and thus the life of the elements can be extended compared with the case of displaying a neutral color by combining only three primary colors. Therefore, a light emitting device in which defective indication due to a deteriorated element is suppressed can be obtained. Further, more colors can be indicated by providing the fourth light emitting element 104; therefore, the range of color reproduction range of a light emitting device is expanded.

Additionally, when the fourth light emitting element 104 emits blue-tinged green as in this embodiment mode, other advantageous effects also include the following. It is necessary to make blue light have higher brightness compared with green light, for example, in order to make the human eye have equal sensitivity to green light and blue light, since the human eye usually has higher sensitivity to green light. In other words, in a display behavior, the third light emitting element 103 which emits blue light has comparatively a greater burden compared with the second light emitting element 102 which emits green light. However, as the light emitting device according to the invention, a burden on the third light emitting element 103 can be relieved, since the fourth light emitting element 104 plays an auxiliary role with respect to the third light emitting element 103 by providing the fourth light emitting element 104 which emits blue-tinged green.

As described above, deterioration of a light emitting element or the reduction in image quality due to the deteriorated light emitting element can be suppressed by relieving a burden on a light emitting element with low luminous efficiency or a light emitting element of a luminescent color to which the human eye has lower sensitivity.

Embodiment 1

In this embodiment, a light emitting device according to the present invention is described. However, the light emitting device according to the invention is not limited to the one shown in this embodiment.

Figure 3:
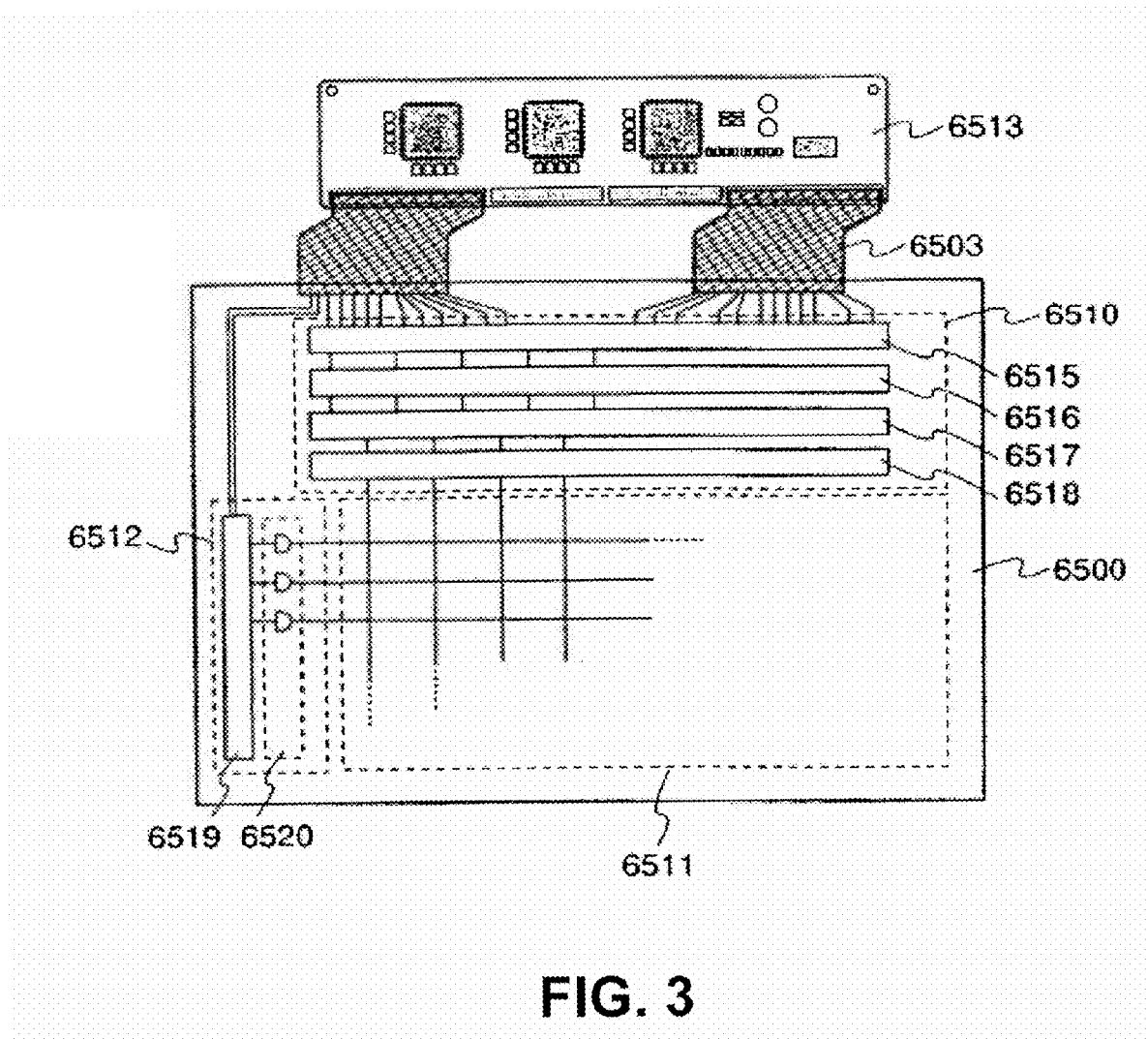
FIG. 3 is a frame format which shows a top view of a light emitting device to which a certain aspect of the invention is applied.

FIG. 3 is a frame format showing a top view of a light emitting device to which the invention is applied. In FIG. 3, reference numeral 6510 shown by a dotted line denotes a drive circuit portion (a source side drive circuit); 6511, a pixel portion; and 6512, a drive circuit portion (a gate side drive circuit). The light emitting element of the invention is provided for the pixel portion 6511. The driver circuit portions 6510 and 6512 are connected to each other through an FPC 6503 which is an external input terminal and one group of wirings formed over a substrate 6500. Signals are inputted into the drive circuit portions 6510 and 6512 by receiving a video signal, a clock signal, a start signal, a reset signal or the like from the FPC (flexible printed circuit) 6503. A printed wiring board (PWB) 6513 is mounted to the FPC 6503. The drive circuit portion 6510 is provided with a shift resistor 6515, a switch 6516, memories (latches) 6517 and 6518, and the driver circuit portion 6512 is provided with a shift resistor 6519 and a buffer 6520.

The drive circuit portions are not necessarily provided over the same substrate as the pixel portion 6511 as described above, and the drive circuit portion may be provided outside the substrate by using, for example, an FPC, over which a wiring pattern is formed, mounting an IC chip thereon (TCP) or the like. A circuit structure of the drive circuit portions 6510 and 6512 is not limited to the above structure and a structure in which a circuit having a different function from the above is further provided may be adopted.

In the pixel portion 6511, a plurality of source signal lines 331 and a plurality of current supply lines 332 extended in columns are arranged in rows. A plurality of first scanning lines 333 and a plurality of second scanning lines 334 extended in rows are arranged in columns. A plurality of pixels 301 in which a first light emitting element 301a, a second light emitting element 301b, a third light emitting element 301c and a fourth light emitting element 301d are in one group, are arranged in matrix.

Further, in a pixel 310, the first light emitting element 301a, the second light emitting element 301b, the third light emitting element 301c and the fourth light emitting element 301d are arranged in rows in the same manner as the light emitting device shown in FIG. 1.

Each light emitting element has a structure in which a light emitting layer including a luminous body is sandwiched between a pair of electrodes. The light emitting layer may be a single layer constituted by only a layer including a luminous body, or may be a multi-layer formed of a plurality of layers in which a layer including a luminous body and a layer containing a substance having superior carrier (an electron, a hole) transportability, a substance having superior carrier injectability, or the like, are combined.

The first light emitting element 301a includes 4-dicyanomethylene-2-methyl-6-(1,1,7,7-tetramethyldurolysyl-9-enyl)-4H-pyran (abbreviation: DCJT) as a luminous body and emits red light. The second light emitting element 301b includes N,N'-dimethylquinacridon (abbreviation: DMQd) as a luminous body and emits green light. The third light emitting element 301c includes 9,9'-bianthryl as a luminous body and emits green light The fourth light emitting element 301d includes coumarin 30 as a luminous body and emits blue-tinged green light. In addition, the luminous body included in each light emitting element is not limited to the above-mentioned luminous body and another luminous body may be used. For example, as a luminous body which emits red light, 4-dicyanomethylene-2-t-butyl-6-(1,1,7,7-terramethyl-durolysyl-9-enyl)-4H-pyran (abbreviation: DPA), Peri-fu-ran-ten, 2,5-dicyano-1,4-bis(10-methoxy-1,1,7,7-tetramethylduroly-syl-9-enyl)benzene, or the like may be used. As a luminous body which emits green light, coumarin 6, coumarin 545T, tris(8-quinolinolate)aluminum (abbreviation: Alq) or the like may be used. As a luminous body which emits blue light, 9,10-diphenylanthracene (abbreviation: DPA), 9,10-bis(2-naphthyl)anthracene (abbreviation: DNA), or the like may be used. As a luminous body which emits blue-tinged green light, bis(2-methyl-8-quinolinolate)-4-phenylphenolate-aluminum (abbreviation: BAlq), bis(2-methyl-8-quinolinolate)-4-phenylphenolate-gallium (abbreviation: BGaq), or the like may be used.

Figure 4:
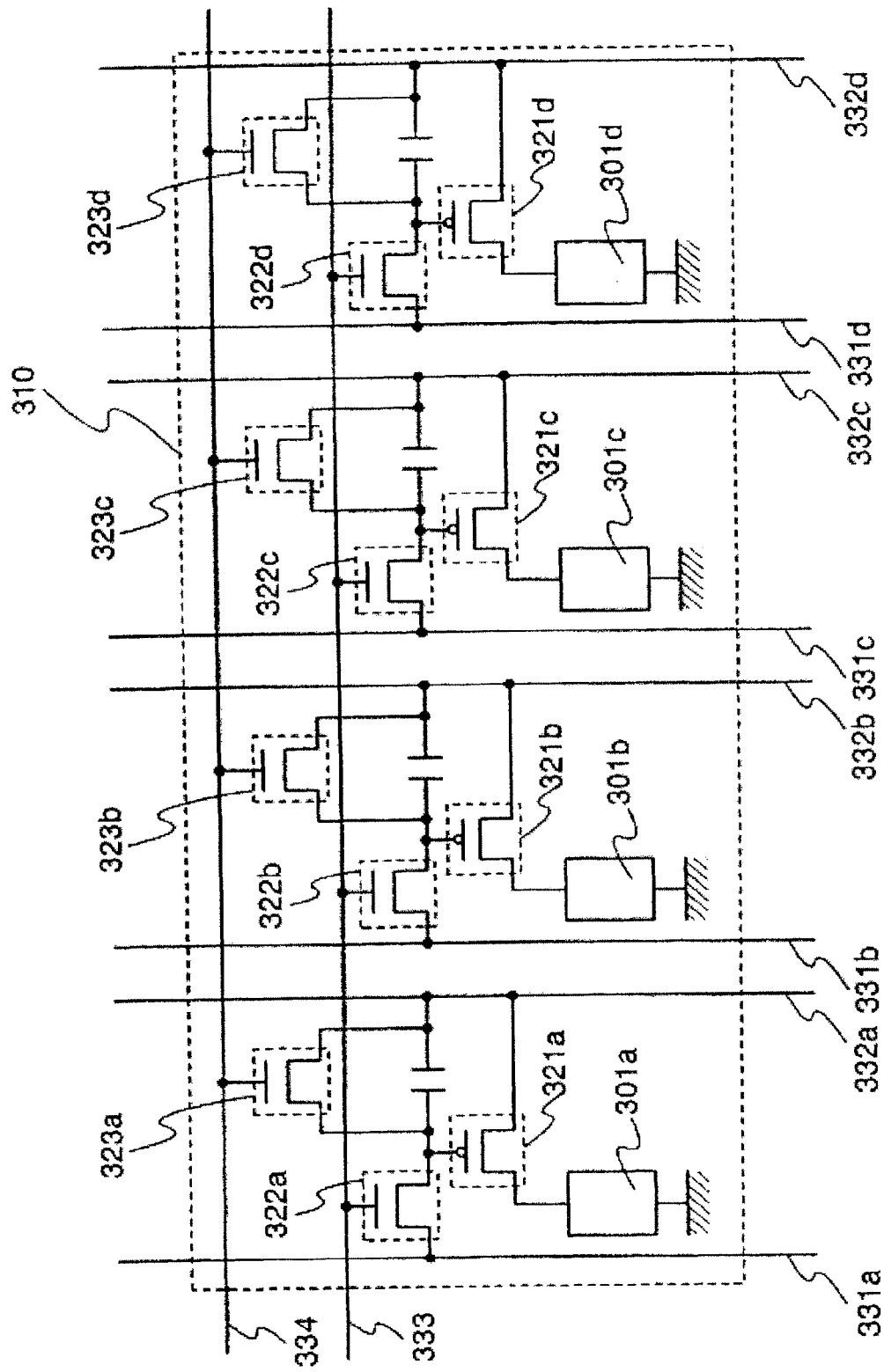
FIG. 4 is a diagram illustrating light emitting elements provided for a light emitting device to which a certain aspect of the invention is applied and circuits for driving the light emitting elements.

As shown in FIG. 4, circuits are connected to the first light emitting element 301a to the fourth light emitting element 301d for driving each light emitting element. Each of the circuits includes driving transistors 321 (321a, 321b, 321c and 321d) that determine a light-emitting or non-light-emitting state of each of the first light emitting element 301a to the fourth light emitting element 301d in accordance with an image signal, switching transistors 322 (322a, 322b, 322c and 322d) that control an input of the image signal, erasing transistors 323 (323a, 323b, 323c and 323d) that control each of the first light emitting element 301a to the fourth light emitting element 301d to be a non-light-emitting state regardless of the image signal. Here, sources (or drains) of the switching transistors 322 are connected to the source signal lines 331, sources of the driving transistors 321 and sources of the erasing transistors 323 are connected to the current supply lines 332 (332a, 332b, 332c and 332d) extending to juxtapose to the source signal lines 331 (331a, 331b, 331c and 331d), gates of the switching transistors 322 are connected to the first scanning line 333, and gates of the erasing transistors 323 extending to juxtapose to the first scanning line 333 are connected to the second scanning line 334. Each of the driving transistors 321 (321a, 321b, 321c and 321d) is serially connected to each of the first light emitting element 301a to the fourth light emitting element 301d. A structure of circuits connected to each light emitting element is not limited to the structure described here, and another structure different from the above may be used.

Figure 5:
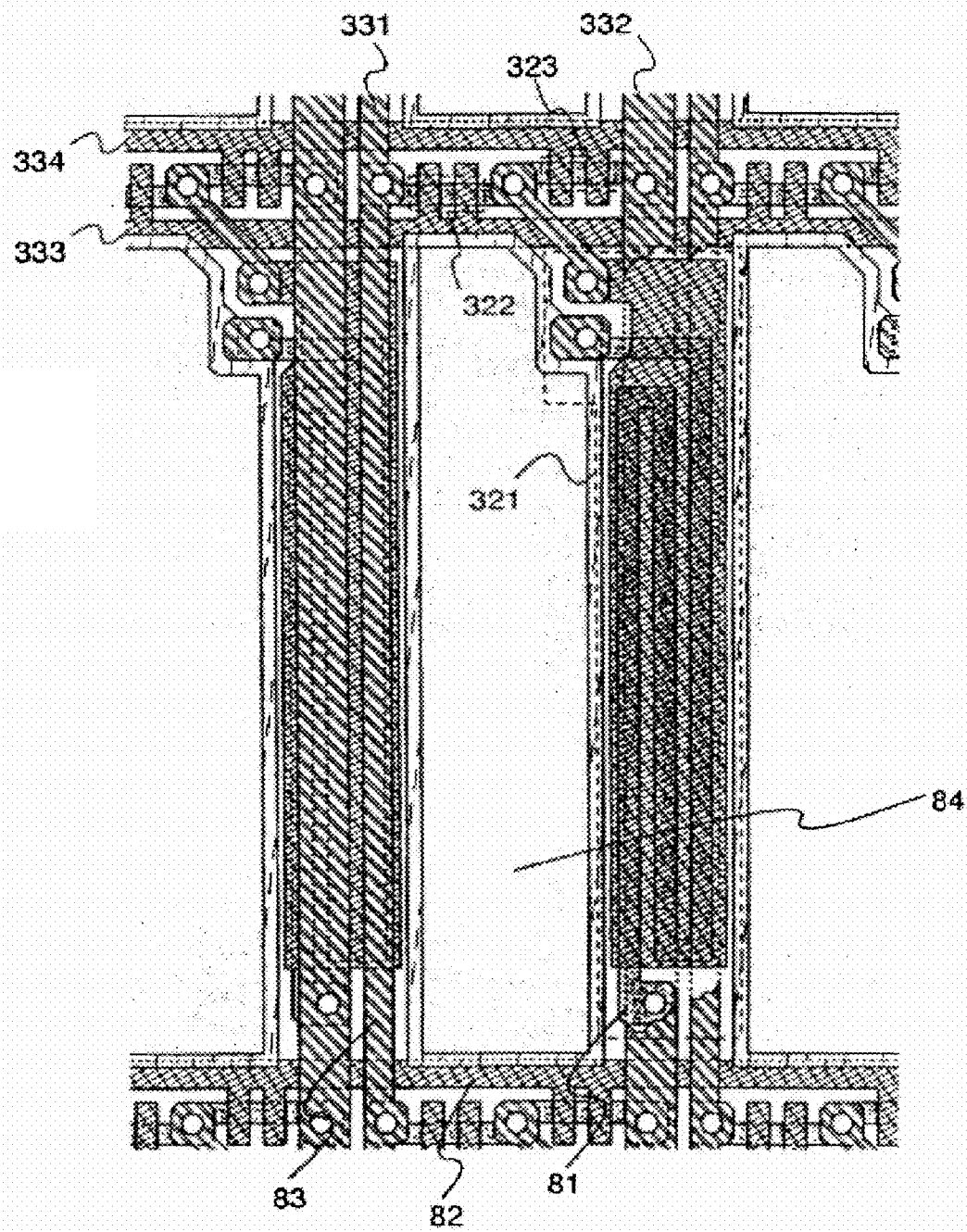
FIG. 5 is a top view of a pixel portion of a light emitting device to which a certain aspect of the invention is applied.

FIG. 5 shows a top view of the pixel portion 6511 of a light emitting device of this embodiment mode. In FIG. 5, only a part of the pixel portion 6511 is illustrated. Note that a structure of a pixel portion of the light emitting device is not limited to the structure shown in FIG. 5, and another structure may be used. In FIG. 5, reference numeral 81 denotes a semiconductor layer, 82, a conductive film functioning as a gate (a gate electrode) of a driving transistor 321, a switching transistor 322, an erasing transistor 323, a first scanning line 333, a second scanning line 334 and the like; and 83, a conductive film functioning as a source signal line 331, a current supply line 332 and the like. In addition, reference numeral 84 denotes a part which has a laminated structure in which a light emitting layer is sandwiched between a pair of electrodes.

Figure 6:
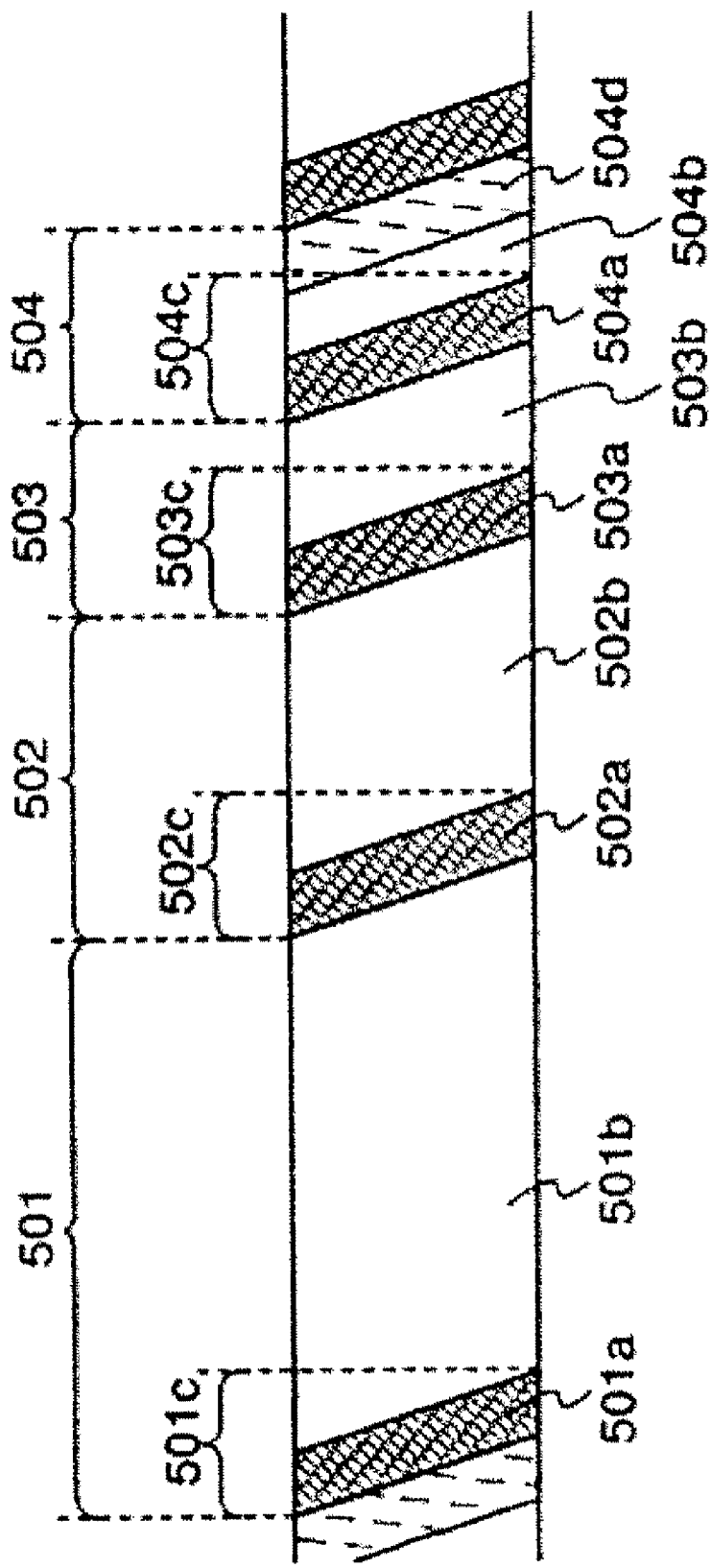
FIG. 6 is a diagram illustrating the frame movement with time course of a tight emitting device to which a certain aspect of the invention is applied.

Hereinafter, the operation of the light emitting device of this embodiment is described with reference to FIG. 6. FIG. 6 is a figure to describe the frame movement with time course.

In FIG. 6, the horizontal direction indicates time course and the vertical direction indicates a scanning direction of a scanning line.

In the light emitting device according to this embodiment, as shown in FIG. 6, time-sharing is performed on a frame to have four subframes: 501, 502, 503 and 504 which include write periods 501a, 502a, 503a and 504a, and store periods 501b, 502b, 503b and 504b. A light emitting element provided with a signal for emitting light is in a light emitting state in the store period. The ratio of store period length in each subframe is, the first subframe 501: the second subframe 502: the third subframe 503: the fourth subframe 504 equal to $2^3$: $2^2$:$2^1$: $2^0$ equal to 8: 4: 2: 1. Accordingly, 4 bits gradation can be expressed. However, the number of bits and the number of gradations is not limited hereto, and for example, 8 subframes may be provided to perform 8 bit gradation.

Movement in one frame will be described. First, in the subframe 501, write movement is sequentially performed from a first line to the last line. Hence, the start time of write period differs according to tines. A line in which the write period 501a is finished sequentially turns to the store period 501b. In the store period, a light emitting element provided with a signal for emitting light is in a light emitting state. A line in which the store period 501b is finished sequentially turns to the next subframe 502, and as in the subframe 501, write movement is sequentially performed from a first line to the last line. By repeating the above-mentioned movement, to the store period 504b in the subframe 504 is finished. When movement in the subframe 504 is finished, movement is turned to the next frame. In this way, integrated time of light emission in each subframe is equivalent to light emitting time of each light emitting element in one frame. By changing the light emitting time in each light emitting element and variously combining the light emitting elements in a pixel portion, diverse display colors in which brightness and chromaticity differ can be formed.

In a subframe 504 in which a store period is shorter than write periods 501c, 502c and 503c in which from a write period of the first line to a write period of the last line are included, an erase period 504d is provided after the store period 504b to compulsorily make the subframe 504 in a non-light-emitting state. Accordingly, the write period of the subframe 504 and the write period of the next subframe thereof can be prevented from being superposed with each other.

In this embodiment, the subframes 501 to 504 are sequentially disposed from the one having the longer store period. However, the subframes are not necessarily disposed as in this embodiment For example, the subframes may be sequentially disposed from the one having the shorter store period, or the one having the longer store period and the one having the shorter store rime may be disposed in random.

Then, circuit operation in a write period is explained. In a write period, the first scanning line 333 in the n-th line (n is natural number) is selected, and the switching transistor 322 connected to the first scanning line 333 turns on. At this time, a video signal is simultaneously inputted to the source signal lines of from the first line to the last line. However, each of the video signals inputted from the source signal lines 331 is independent with each other. The video signals simultaneously inputted from the source signal lines 331 are inputted to the gates of the driving transistors 321 through the switching transistors 322. At this time, according to the signals inputted into the driving transistors 321, each of from the first light emitting element 301a to the fourth light emitting element 301d is determined to be a light emitting state or a non-light-emitting state.

At the same time of finishing writing to the source signal lines, the write period in the n-th line (n is natural number) is finished and turned to a store period. Then, an n-th plus 1 line turns to a write period and write movement similar to the above is performed. By repeating the above-mentioned movement, write movement is performed from the first line to the last line.

A light emitting device to which the invention having the above-mentioned structure is applied, relieves a burden on a light emitting element having low luminous efficiency or a light emitting element of a luminescent color to which the human eye has lower sensitivity. Accordingly, the deterioration of the light emitting element or the reduction in image quality due to the deteriorated light emitting element is suppressed. Further, more colors can be indicated; therefore, the range of color reproduction range of a tight emitting device is expanded.

Embodiment 2

In this embodiment, a light emitting device in which arrangement of light emitting elements in one pixel is different from the one shown in FIG. 1 is described.

Figure 7:
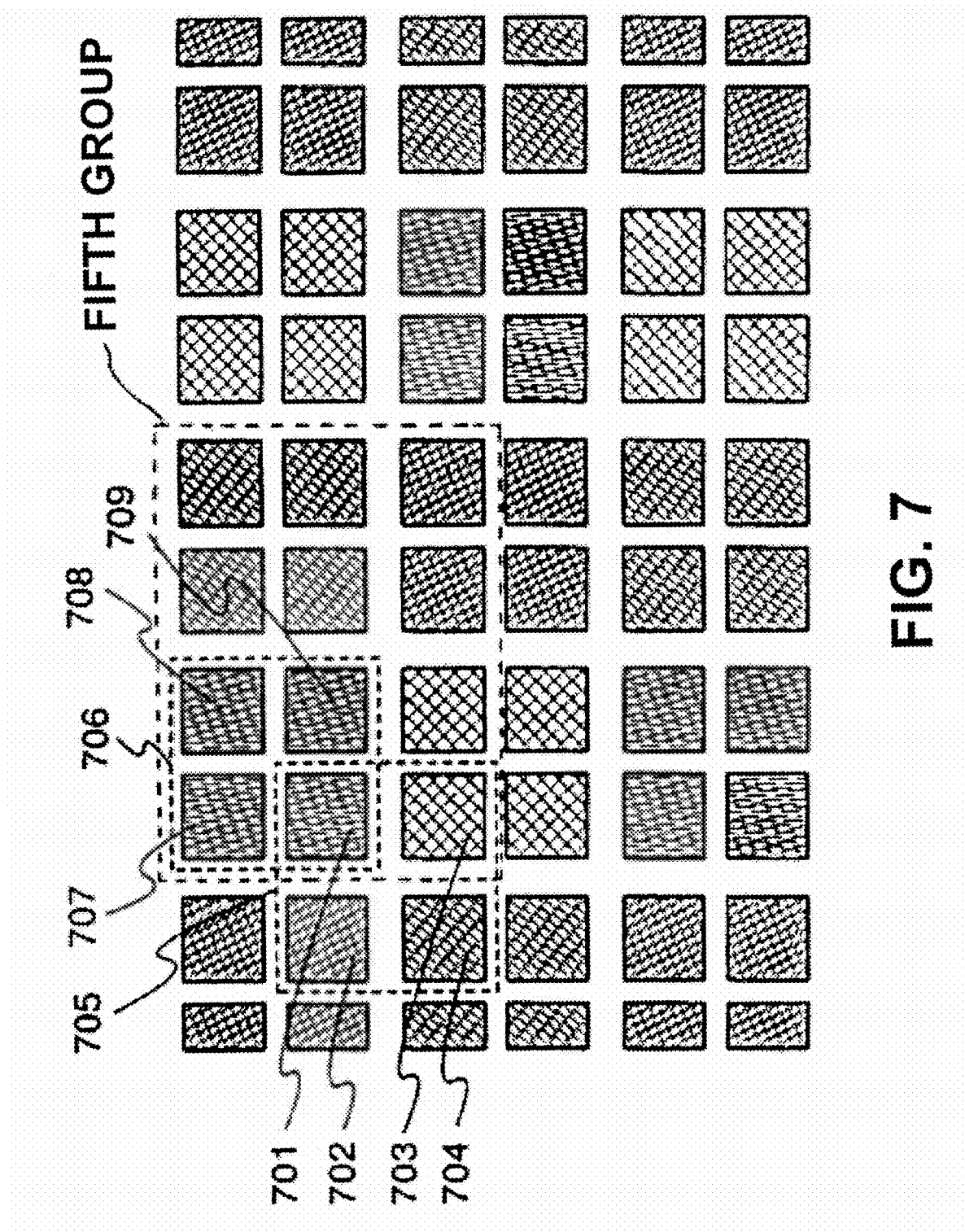
FIG. 7 is a diagram explaining pixels provided for a light emitting device and the arrangement of light emitting elements constituting the pixels to which a certain aspect of the invention is applied.

A light emitting device in this embodiment has a first light emitting element 701 which emits red light, a second light emitting element 702 which emits green light, a third light emitting element 703 which emits blue light, and a fourth tight emitting element 704 which emits blue-tinged green light as shown in FIG. 7.

In the light emitting device in this embodiment, each of from the first light emitting element 701 to the fourth light emitting element 704 has four light emitting elements which are arranged in two rows and in two columns. A pixel 705 includes four light emitting elements, namely the first light emitting element 701 to the fourth light emitting element 704. A plurality of the pixels 705 are arranged.

In the light emitting device in this embodiment, as the first light emitting element 701, a first light emitting element 707, a first light emitting element 708, and a first light emitting element 709 surrounded by a dotted line 706, four light emitting elements which indicate the same color is included as one group. The four light emitting elements are provided as a group two of which are each arranged in a row and a column. The group is provided for each of light emitting elements which indicate the same color. In a fifth group where a first group including four light emitting elements which emit red light as the first light emitting element 701, a second group including four light emitting elements which emit green light as the second light emitting element 702, a third group including four light emitting elements which emit blue light as the third light emitting element 703, and a fourth group including four light emitting elements which emit blue-tinged green light as the fourth light emitting element 704, are included as a group, the first group to the fourth group are arranged in two rows and in two columns. One group of one light emitting element included in the first group, one light emitting element included in the second group, one light emitting element included in the thud group, and one tight emitting element included in the fourth group constitutes one pixel.

The width between light emitting elements included in a group is constituted so as to be narrower than that of light emitting elements included in different groups and adjacent to each other.

In other words, in the light emitting device of this embodiment, light emitting elements are arranged so that the width between light emitting elements which have the same luminescent color and are adjacent to each other is narrower than that of light emitting elements which have different luminescent colons and are adjacent to each other.

When light emitting layers are formed by evaporation, the light emitting layers which correspond to light emitting elements indicating each luminescent color are individually formed by using a mask made from metal or the like. At this time, the width of light emitting elements which have different luminescent colors and are adjacent to each other is provided so as to be about from 20 μm to 30 μm, in order to prevent light emitting layers of light emitting elements which indicate different luminescent colors from entering from edges and being mixed with each other or the like.

However, by employing a light emitting device having a structure as shown in FIG. 7, there is no need for considering the prevention of color mixture between light emitting elements which have the same luminescent color and are adjacent to each other. Therefore, the width between light emitting elements can be made narrower than that of light emitting elements which have different luminescent colors and adjacent to each other. Accordingly, light-emission area (area of an electrode side where emitted light can be extracted) of each light emitting element can be expanded. As a result, luminous efficiency, particularly, light-extraction efficiency can be enhanced.

Although the pixels shown in FIG. 7 have square shapes, circular shapes or the like can be used without being limited thereto. When the pixels are made to have circular shapes in particular, the effect that the light emitting elements are not easily deteriorated can be obtained.

A light emitting device to which the invention having the above-mentioned structure is applied, relieves a burden on a light emitting element having low luminous efficiency or a light emitting element of a luminescent color to which the human eye has lower sensitivity. Accordingly, the deterioration of the light emitting element or the reduction in image quality due to the deteriorated light emitting element is suppressed. Further, more colors can be indicated; therefore, the range of color reproduction range of a light emitting device is expanded.

Embodiment 3

In this embodiment, a cross-sectional structure of a light emitting device to which the present invention is applied is explained. However, the structure of the light emitting device according to the invention and a substance constituting the tight emitting device and the tike are not limited to those shown in this embodiment.

In FIGS. 8A to 8C, a transistor 11 surrounded by a dotted line is provided for driving a light emitting element 12. The light emitting element 12 corresponds to any one of the first light emitting element 301a to the fourth light emitting element 301d shown in Embodiment 1, and the transistor 11 corresponds to any one of driving transistors 321a to 321d shown in Embodiment 1. The light emitting element 12 includes a first electrode 13, a second electrode 14, and a light emitting layer 15 sandwiched by these electrodes. A drain of the transistor 11 and the first electrode 13 are electrically connected to each other by a wiring 17 which passes through a first interlayer insulating film 16 (16a, 16b and 16c). In addition, the light emitting element 12 is separated from another light emitting element provided to be adjacent to each other by a partition wall layer 18. In this embodiment, a light emitting device of the invention having such a structure is provided over a substrate 10.

The light emitting layer 15 in the light emitting element 12 includes a plurality of layers in which a mixed layer including a luminous body and a substance having superior carrier transportability, a layer including a substance having superior carrier (an electron, a hole) transportability, and a layer including a substance having superior carrier injectability are laminated. A luminescent color of the light emitting element 12 is determined by a luminous body included in the light emitting layer 15. Note that the combination of substances which constitutes the light emitting layer 15 may be different in each light emitting element. As the luminous body, the luminous body shown in Embodiment Mode may be used. As the substance having superior electron transportability in particular, among substances having superior carrier transportability, for example, a metallic complex having a quinoline frame or a benzoquinoline frame such as tris(8-quinolinolate) aluminum (abbreviation: Alq$_3$), tris(5-methyl-8-quinolinolate)aluminum (abbreviation: Almq$_3$), bis(10-hydroxybenzo[h]quinolinato)beryllium (abbreviation: BeBq$_2$), bis(2-methyl-8-quinolinolate)-4-phenylphenolate-aluminum (abbreviation: BAlq) or the like, can be given. As a substance having superior hole transportability, for example, a compound of aromatic amine system (in other words, a compound having the bond of benzene ring-nitrogen) such as 4,4'-bis[N-(1-naphthyl)-N-phenyl-amino]-biphenyl (abbreviation: α-NPD), 4,4'-bis[N-(3-methylphenyl)N-phenyl-amino]-biphenyl (abbreviation: TPD), 4,4',4''-tris(N,N-diphenyl-amino)-triphenylamine (abbreviation: TDATA), or 4,4',4''-tris[N-(3-methylphenyl)-N-phenyl-amino)]-triphenylamine (abbreviation: MTDATA) are given. In addition, as the substance having superior electron injectability in particular, among substances having superior carrier injectability, a compound of alkali metal or alkaline-earth metal such as lithium fluoride (LiF), cesium fluoride (CsF) or calcium fluoride (CaF$_2$) are given. In addition to these, a mixture of a substance having high electron transportability such as Alq$_3$, and alkaline-earth metal such as magnesium (Mg) may be used. As the substance having high hole injectability, for example, metal oxide such as molybdenum oxide (MoOx), vanadium oxide (VOx), ruthenium oxide (RuOx), tungsten oxide (WOx) or manganese oxide (MnOx) are given. In addition to these, a phthalocyanine system compound such as phthalocyanine (abbreviation: H$_2$Pc) or copper phthalocyanine (CuPc) are given.

The transistor 11 is a top gate type. However, the structure of the transistor 11 is not particularly limited, and for example, it may be an inverse stagger type as shown in FIG. 9A. When the transistor is an inverse stagger type, it may be a structure in which a protective film is formed over a semiconductor layer forming a channel (a channel protective type) as shown in FIG. 9B, or it may be a structure in which a part of a semiconductor layer forming a channel becomes a concave shape (a channel etch type). Reference numeral 21 denotes a gate electrode; 22, a gate insulating film; 23, a semiconductor layer; 24, an n-type semiconductor layer, 25, an electrode; and 26, a protective film.

The semiconductor layer constituting the transistor 11 may be either crystalline or noncrystalline. Further, it may be semi-amorphous or the like.

A semi-amorphous semiconductor is explained hereinafter. A semi-amorphous semiconductor is a semiconductor having an intermediate structure of an noncrystalline structure and a crystal structure (including monocrystal and polycrystal), and having a stable third state with respect to free energy, and including a crystalline region having a short distance order and lattice distortion. A crystal grain having a grain diameter of from 0.5 nm to 20 nm is included in at least one region of the semi-amorphous semiconductor film, and the Raman spectrum shifts to the tower side of wave number of 520 cm$^{-1}$. In addition, in x-ray diffraction, a diffraction peak of (111) and (220) derived from a Si crystal lattice is observed. The semi-amorphous semiconductor film includes hydrogen or halogen at least 1 atomic % or more as a neutralizer of an uncombined hand (a dangling bond). Therefore, a semi-amorphous semiconductor is also referred to as a microcrystal semiconductor. The semi-amorphous semiconductor film is manufactured by performing glow discharging decomposition (plasma CVD) of a suicide gas. As the silicide gas, SiH$_4$, additionally, Si$_2$H$_6$, SiH$_2$Cl$_2$, SiHCl$_3$, SiCl$_4$, SiF$_4$, or the like can be used The silicide gas may be diluted with H$_2$, or H$_2$ and one or more of rare gas elements: He, Ar, Kr, and Ne. Dilution ratio is within the range of from 2 times to 1000 times. Pressure is roughly within the range of from 0.1 Pa to 133 Pa; power frequency, from 1 MHz to 120 MHz, preferably from 13 MHz to 60 MHz; and substrate heating temperature, at most 300° C. or less, preferably from 100° C. to 250° C. An atmospheric constitution impurity such as oxygen, nitrogen or carbon as an impurity element within a film is preferably 1×10$^{20}$ atoms/cm$^3$ or less, in particular, oxygen concentration is 5×10$^{19}$ atoms/cm$^3$ or less, preferably, 1×10$^{19}$ atoms/cm$^3$ or less. Note that a mobility of a TFT (thin film transistor) using a semiconductor having a semi-amorphous semiconductor is about from 1 m$^2$/Vsec to 10 cm$^2$/Vsec.

As a specific example of a semiconductor layer having crystallinity, a semiconductor layer including monocrystal silicon or polycrystal silicon, silicon germanium and the like are given. These semiconductor layers may be formed by laser crystallization or for example, crystallization by a solid phase growth method using nickel or the like.

When the semiconductor layer is formed from noncrystalline substance, for example, from amorphous silicon, a light emitting device having a circuit in which the transistor 11 and the other transistor (a transistor constituting a circuit for driving a light emitting element) are all n-channel transistors, is preferable. As for other light emitting devices, either a light emitting device having a circuit including either an n-channel transistor or a p-channel transistor, or a light emitting device having a circuit including both transistors, may be used.

Further, the first interlayer insulating film 16 may be multi-layer as shown in FIGS. 8A and 8C, or a single layer. A first interlayer insulating film 16a includes an inorganic material such as silicon oxide or silicon nitride, a first interlayer insulating film 16b includes a substance having self-planarization such as acrylic, siloxane (a substance which has a skeleton formed by the bond of silicon (Si) and oxygen (O), and which includes at least hydrogen as a substituent), or silicon oxide which can be formed by application (spin coating). Note that a substance which constitutes each layer is not particularly limited and other substances not described here can be used In addition, a layer formed from another substance may be further combined. Thus, the first interlayer insulating film 16 may be formed by using both an inorganic material and an organic material, or may be formed of either an inorganic film or an organic film.

It is preferable that a partition wall layer 18 has a shape in which curvature radius continuously changes in an edge portion. The partition wall layer 18 is formed with acrylic, siloxane, a resist, silicon oxide or the like. The partition wall layer 18 may be formed from either an inorganic material film or an organic material film, or formed with the both.

In FIGS. 8A and 8C, it is a structure in which only the first interlayer insulating film 16 is provided between the transistor 11 and the light emitting element 12. However, it may be a structure in which a second interlayer insulating film 19 (19a and 19b) are provided therebetween in addition to the first interlayer insulating film 16 (16a and 16b), as shown in FIG. 8B. In the light emitting device shown in FIG. 8B, the first electrode 13 passes through the second interlayer insulating film 19 and is connected to the wiring 17.

The second interlayer insulating film 19 may be multilayer or a single layer as in the first interlayer insulating film 16. The interlayer insulating film 19a includes a substance having self-planarization such as acrylic, siloxane (a substance which has a skeleton formed by the bond of silicon (Si) and oxygen (O), and which includes at least hydrogen as a substituent), or silicon oxide which can be formed by application (spin coating). Further, the second interlayer insulating film 19b is formed from a silicon nitride film containing argon (Ar). Note that the substance which constitutes each layer is not particularly limited and other substances not described here can be used. In addition, a layer formed from another substance may be further combined. Thus, the second interlayer insulating film 19 may be formed by using both an inorganic material and an organic material, or may be formed of either an inorganic film or an organic film.

In the light emitting element 12, in the case where both the first electrode 13 and the second electrode 14 are formed from a substance having tight-transmitting properties such as indium tin oxide (ITO), emitted light can be extracted from both the first electrode 13 side and the second electrode 14 side as indicated by outline arrows in FIG. 8A. In the case where only the second electrode 14 is formed from a substance having light-transmitting properties, emitted light can be extracted from only the second electrode 14 side as indicated by an outline arrow in FIG. 8B. In this case, it is preferable that the first electrode 13 includes a highly reflective material or that a film including a highly reflective material (a reflective film) is provided under the first electrode 13. In the case where only the first electrode 13 is formed from a substance having light-transmitting properties, emitted light can be extracted from only the first electrode 13 side as indicated by an outline arrow in FIG. 8C. In this case, it is preferable that the second electrode 14 is formed from a highly reflective material or that a reflective film is provided over the second electrode 14.

In addition, the light emitting element 12 may have a structure in which the first electrode 13 functions as an anode while the second electrode 14 functions as a cathode, or alternatively, a structure in which the first electrode 13 functions as a cathode while the second electrode 14 functions as an anode. Note that the transistor 11 is a p-channel transistor in the former case, and the transistor 11 is an n-channel transistor in the latter case.

A light emitting device to which the invention having the above-mentioned structure is applied, relieves a burden on a light emitting element having low luminous efficiency or a light emitting element of a luminescent color to which the human eye has lower sensitivity. Accordingly, the deterioration of the light emitting element or the reduction in image quality due to the deteriorated light emitting element is suppressed. Further, more colors can be indicated; therefore, the range of color reproduction range of a light emitting device is expanded.

Embodiment 4

In this embodiment mode, a light emitting element having a circuit structure which is different from the one shown in FIG. 4 is described with reference to FIG. 10.

Figure 10:
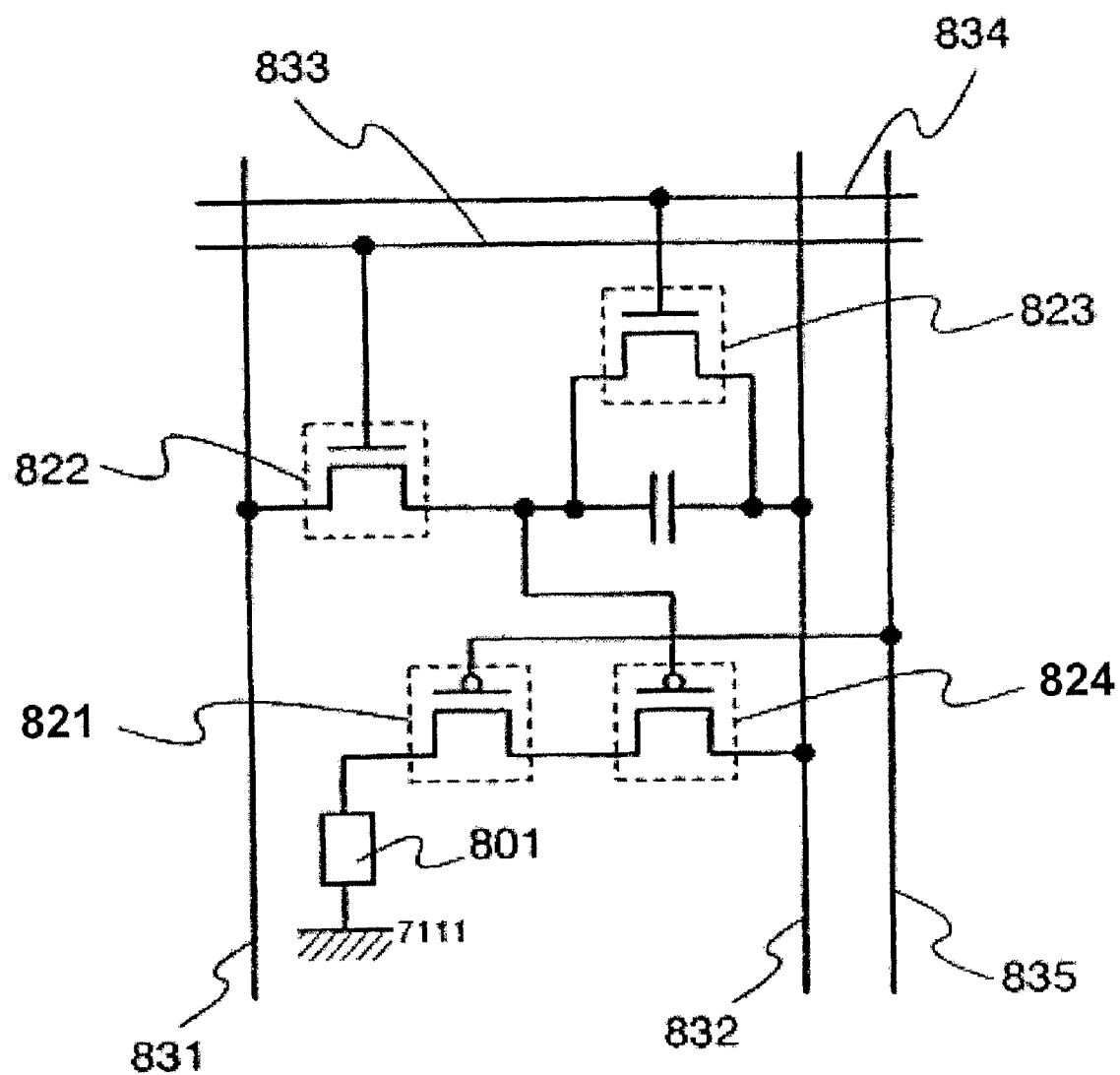
FIG. 10 is a diagram illustrating a light emitting element provided for a light emitting device and circuits for driving the light emitting element to which a certain aspect of the invention is applied.

As shown in FIG. 10, circuits for driving each light emitting element are connected to a light emitting element 801. The circuit includes a driving transistor 824 that determines a light-emitting or non-light-emitting state of the light emitting element 801 in accordance with an image signal, a switching transistor 822 that controls an input of the image signal, an erasing transistor 823 that controls the light emitting element 801 to be a non-light-emitting state regardless of the image signal, and a current control transistor 821 to control the current value supplied to the light emitting element 801. Here, a source (or a drain) of the switching transistor 822 is connected to a source signal line 831, a source of the driving transistor 824 and a source of the erasing transistor 823 are connected to a current supply line 832 extending to juxtapose to the source signal line 831, a gate of the switching transistor 822 is connected to a first scanning line 833, and a gate of the erasing transistor 823 extending to juxtapose to the first scanning line 833 is connected to a second scanning line 834. The current control transistor 821 is sandwiched between the driving transistor 824 and the light emitting element 801 and serially connected to one another. A gate of the current control transistor 821 is connected to a power supply line 835. Note that the current control transistor 821 is configured and controlled so that current flows in a saturation region in voltage-current (Vd-Id) characteristics. Accordingly, the intensity of the current value flown to the current control transistor 821 can be determined.

A driving method when the light emitting element 801 emits light is described. When the first scanning line 833 is selected in a writing period, the switching transistor 822 that has a gate connected to the first scanning line 833 is turned on. Then, an image signal inputted to the source signal line 831 is inputted to a gate of the driving transistor 824 through the switching transistor 822. Further, current flows from the current supply line 832 to the light emitting element 801 through the driving transistor 824, and the current control transistor 821 which becomes an on-state due to a signal from the power supply line 835 to emit light. At this time, the current value flowing to the light emitting element is determined by the current control transistor 821.

The description in FIG. 10 is made about one light emitting element 801. However, in the light emitting device of this embodiment, four light emitting elements, each of which is a light emitting element operated by the same circuit connected to the light emitting element, are arranged as in FIG. 4. A plurality of pixels, each of which has a group of four light emitting elements are arranged. Note that each light emitting element included in a pixel indicates a different color.

Figure 11:
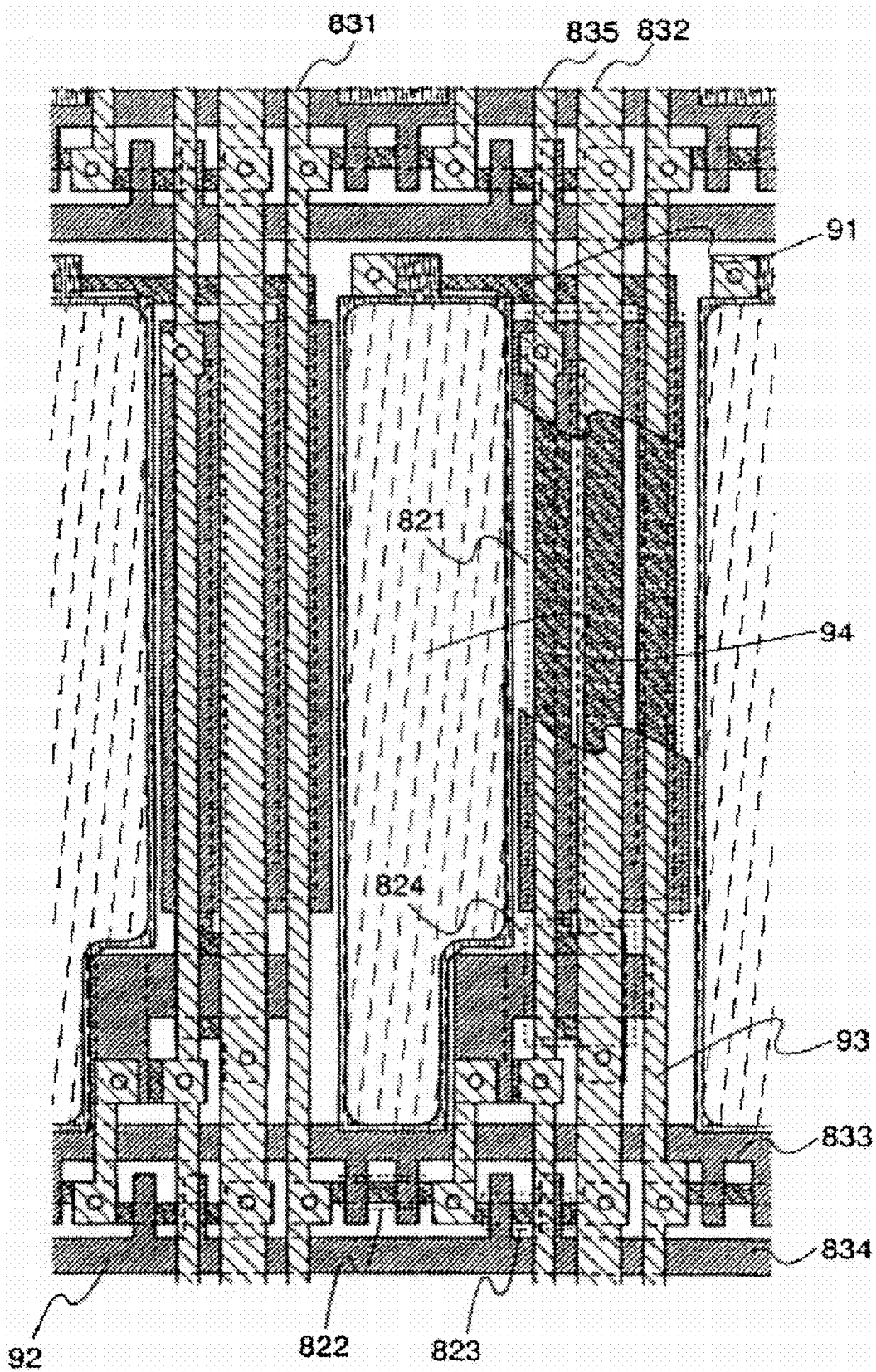
FIG. 11 is a top view of a pixel portion of a light emitting device to which a certain aspect of the invention is applied.

FIG. 11 shows a top view of a pixel portion of a light emitting device having a circuit structure as shown in this embodiment. In FIG. 11 only a part of the pixel portion is illustrated. Note that a structure of a pixel portion of a light emitting device is not limited to the structure shown in FIG. 11, and another structure may be used In FIG. 11 reference numeral 91 denotes a semiconductor layer, 92, a conductive film functioning as a gate (a gate electrode) of a current controlling transistor 821, a switching transistor 822, an erasing transistor 823, a driving transistor 824, first scanning lines 833 and 834 and the like; and 93, a conductive film functioning as a source signal line 831, a current supply line 832, a power supply line 835 and the like. In addition, reference numeral 94 denotes a part which has a laminated structure in which a light emitting layer is sandwiched between a pair of electrodes.

A light emitting device to which the invention having the above-mentioned structure is applied, relieves a burden on a light emitting element having low luminous efficiency or a light emitting element of a luminescent color to which the human eye has lower sensitivity. Accordingly, the deterioration of the light emitting element or the reduction in image quality due to the deteriorated light emitting element is suppressed Further, more colors can be indicated; therefore, the range of color reproduction range of a light emitting device is expanded.

Embodiment 5

The light emitting devices shown in Embodiments 1 to 4 to which the present invention is applied is mounted to a wide variety of electronic devices after mounting an external input terminal and being sealed.

An electronic device to which the invention is applied is an electronic device in which the deterioration of a light emitting element or the reduction in image quality due to the deteriorated element is suppressed; therefore, a preferable display can be obtained. Moreover, in the light emitting device, more colors can be indicated and color reproduction range is expanded.

In this embodiment, a light emitting device to which the invention is applied and an electronic device to which the light emitting device is mounted are described with reference to FIGS. 12 and 13. Nonetheless, the light emitting device and the electronic device shown in FIGS. 12 and 13 are just examples, and the structures of the light emitting device and the electronic device are not particularly limited thereto.

Figure 12:
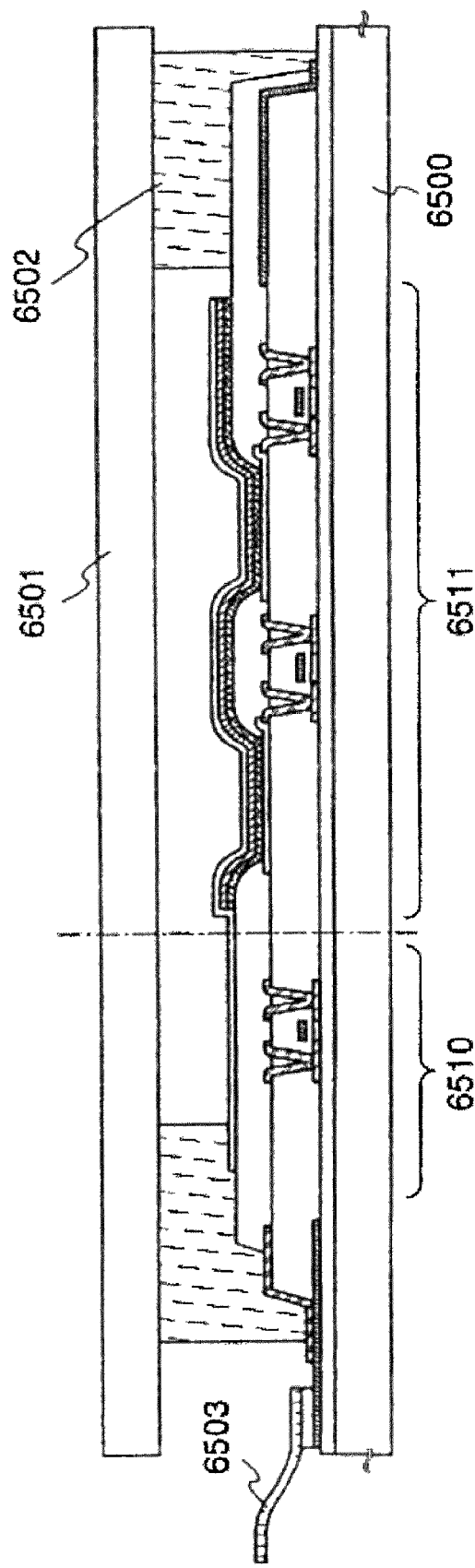
FIG. 12 is a cross-sectional view after sealing a light emitting device to which a certain aspect of the invention is applied.

FIG. 12 is a cross-sectional view after sealing a light emitting device to which the invention is applied A top frame format of FIG. 12 corresponds to FIG. 3 described on ahead. A substrate 6500 and a sealing substrate 6501 are attached to each other with a sealant 6502 so as to sandwich a transistor and a light emitting element of the present invention therebetween. At the end of the substrate 6500, an FPC (flexible printed circuit) 6503 which is to be an external input terminal is mounted Note that the region sandwiched by the substrate 6500 and the sealing substrate 6501 is filled with an inert gas such as nitrogen or a resin material.

Figure 13:
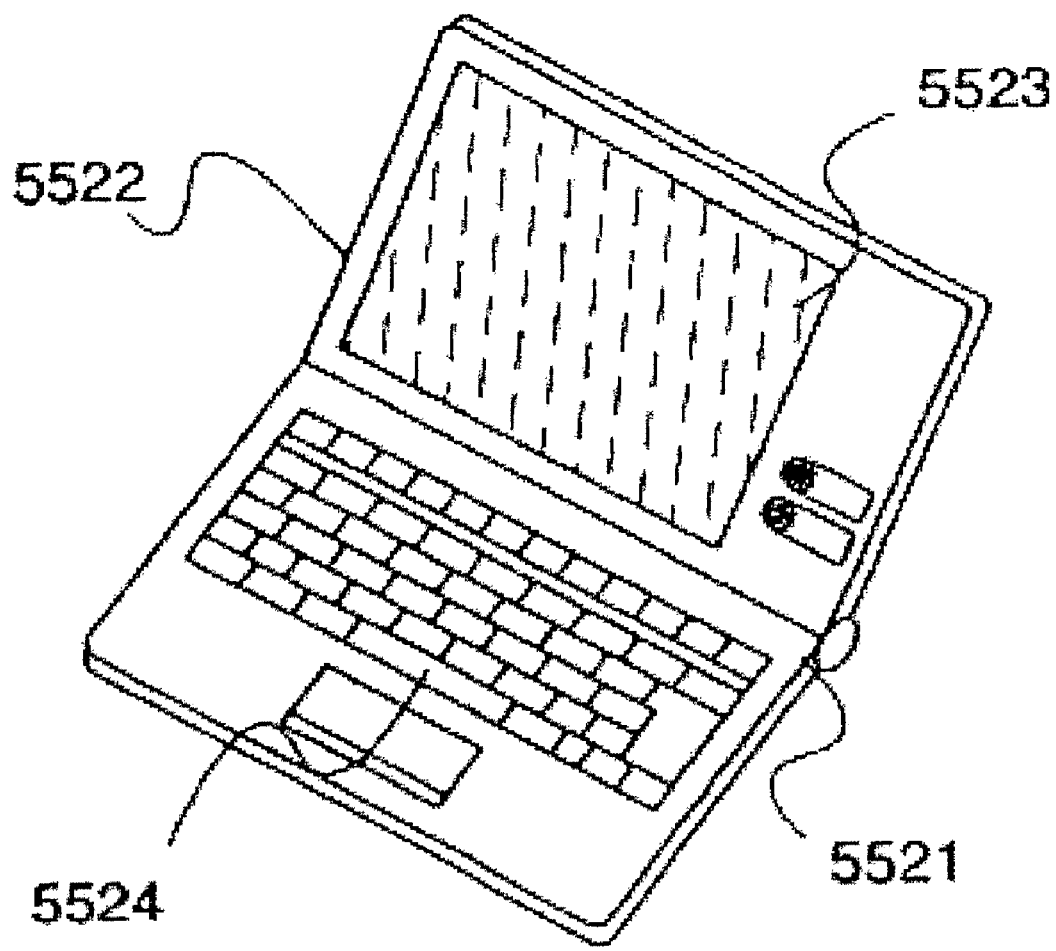
FIG. 13 is a view showing an electronic device to which a light emitting device manufactured by applying a certain aspect of the invention is mounted.

One embodiment of an electronic device in which a light emitting device to which the invention is applied is mounted is shown in FIG. 13.

FIG. 13 illustrates a laptop personal computer manufactured by applying the invention, which includes a main body 5521, a chassis 5522, a display portion 5523 and a keyboard 5524 and the like. A display device can be completed by incorporating a light emitting device having a light emitting element of the invention in a personal computer.

In this embodiment, although it is described about a laptop personal computer; in addition to this, a light emitting device having a light emitting element of the invention may be mounted to a mobile phone, a television receiver, a car navigation system or a lighting device and the like.

What is claimed is:

1. A light emitting device comprising a plurality of light emitting elements having different luminescent colors, the device comprising:
    a first group including four first light emitting elements which emit a first color with the first light emitting elements arranged in two rows and in two columns;
    a second group including four second light emitting elements which emit a second color, with the second light emitting elements arranged in two rows and in two columns;
    a third group including four third light emitting elements which emit a third color with the third light emitting elements arranged in two rows and in two columns; and
    a fourth group including four fourth light emitting elements which emit a fourth color with the fourth light emitting elements arranged in two rows and in two columns,
    wherein the first group, the second group, the third group and the fourth group are arranged in rows and columns of two groups each, and the width between light emitting elements included in the same group and adjacent to each other is narrower than that of light emitting elements included in different groups and adjacent to each other,
    wherein the first color is red, the second color is green, the third color is blue and the fourth color is red-purple or yellow-orange.

2. The light emitting device according to claim 1,
    wherein the first light emitting elements emit a color having coordinates in the region where x in a chromaticity diagram is 0.6 or more, and y is 0.35 or less, when the color is indicated by a CIE-XYZ color system;
    wherein the second light emitting elements emit a color having coordinates in the region where x in a chromaticity diagram is 0.3 or less, and y is 0.6 or more, when the color is indicated by a CIE-XYZ color system;
    wherein the third light emitting elements emit a color having coordinates in the region where x in a chromaticity diagram is 0.15 or less, and y is 0.2 or less, when the color is indicated by a CIE-XYZ color system; and
    wherein the fourth light emitting elements emit a color having coordinates in the region where x in a chromaticity diagram is 0.15 or less, and y is 0.25 or more and 0.5 or less, when the color is indicated by a CIE-XYZ color system.

3. A light emitting device comprising:
    a first region including at least four first light emitting elements, each of the first light emitting elements configured to emit a first color;
    a second region including at least four second light emitting elements, each of the second light emitting elements configured to emit a second color wherein the first region and the second region are arranged in a first row;
    a third region including at least four third light emitting elements, each of the third light emitting elements configured to emit a third color wherein the third region is arranged in a second row different from the first row;
    a fourth region including at least four fourth light emitting elements, each of the fourth light emitting elements configured to emit a fourth color wherein the fourth region is arranged in the second row;
    a pixel comprising at least one of the four first light emitting elements of the first region, at least one of the four second light emitting elements of the second region, at least one of the four third light emitting elements of the third region, and at least one of the four fourth light emitting elements of the fourth region,
    wherein a distance between adjacent ones of the four first light emitting elements in the first region is smaller than a distance between the first region and the second region, and
    wherein the first color is red, the second color is green, the third color is blue and the fourth color is red-purple or yellow-orange.

4. The light emitting device according to claim 3, wherein the third region is arranged in a same column as one of the first and second regions.

5. A light emitting device comprising a plurality of light emitting elements having different luminescent colors, the device comprising:
    a first group including four first light emitting elements which emit a first color with the first light emitting elements arranged in two rows and in two columns;

a second group including four second light emitting elements which emit a second color with the second light emitting elements arranged in two rows and in two columns;

a third group including four third light emitting elements which emit a third color with the third light emitting elements arranged in two rows and in two columns;

a fourth group including four fourth light emitting elements which emit a fourth color with the fourth light emitting elements arranged in two rows and in two columns;

wherein the first group, the second group, the third group and the fourth group are arranged in rows and columns of two groups each, and wherein the first color is red, the second color is green, the third color is blue and the fourth color is red-purple or yellow-orange.

6. The light emitting device according to claim 5, wherein the first light emitting elements emit a color having coordinates in the region where x in a chromaticity diagram is 0.6 or more, and y is 0.35 or less, when the color is indicated by a CIE-XYZ color system;

wherein the second light emitting elements emit a color having coordinates in the region where x in a chromaticity diagram is 0.3 or less, and y is 0.6 or more, when the color is indicated by a CIE-XYZ color system;

wherein the third light emitting elements emit a color having coordinates in the region where x in a chromaticity diagram is 0.15 or less, and y is 0.2 or less, when the color is indicated by a CIE-XYZ color system; and wherein the fourth light emitting elements emit a color having coordinates in the region where x in a chromaticity diagram is 0.15 or less, and y is 0.25 or more and 0.5 or less, when the color is indicated by a CIE-XYZ color system.

7. A display device comprising a plurality of light emitting elements having different luminescent colors, the device comprising:

a first group including four first light emitting elements which emit a first color with the first light emitting elements arranged in two rows and in two columns;

a second group including four second light emitting elements which emit a second color, with the second light emitting elements arranged in two rows and in two columns;

a third group including four third light emitting elements which emit a third color with the third light emitting elements arranged in two rows and in two columns; and a fourth group including four fourth light emitting elements which emit a fourth color with the fourth light emitting elements arranged in two rows and in two columns, wherein the first group, the second group, the third group and the fourth group are arranged in rows and columns of two groups each, and the width between light emitting elements included in the same group and adjacent to each other is narrower than that of light emitting elements included in different groups and adjacent to each other, wherein the first color is red, the second color is green, the third color is blue and the fourth color is red-purple or yellow-orange.

8. The display device according to claim 7, wherein the first light emitting elements emit a color having coordinates in the region where x in a chromaticity diagram is 0.6 or more, and y is 0.35 or less, when the color is indicated by a CIE-XYZ color system;

wherein the second light emitting elements emit a color having coordinates in the region where x in a chromaticity diagram is 0.3 or less, and y is 0.6 or more, when the color is indicated by a CIE-XYZ color system;

wherein the third light emitting elements emit a color having coordinates in the region where x in a chromaticity diagram is 0.15 or less, and y is 0.2 or less, when the color is indicated by a CIE-XYZ color system; and wherein the fourth light emitting elements emit a color having coordinates in the region where x in a chromaticity diagram is 0.15 or less, and y is 0.25 or more and 0.5 or less, when the color is indicated by a CIE-XYZ color system.

9. A display device comprising:

a first region including at least four first light emitting elements, each of the first light emitting elements configured to emit a first color;

a second region including at least four second light emitting elements, each of the second light emitting elements configured to emit a second color wherein the first region and the second region are arranged in a first row;

a third region including at least four third light emitting elements, each of the third light emitting elements configured to emit a third color wherein the third region is arranged in a second row different from the first row;

a fourth region including at least four fourth light emitting elements, each of the fourth light emitting elements configured to emit a fourth color wherein the fourth region is arranged in the second row;

a pixel comprising at least one of the four first light emitting elements of the first region, at least one of the four second light emitting elements of the second region, at least one of the four third light emitting elements of the third region, and at least one of the four fourth light emitting elements of the fourth region, wherein a distance between adjacent ones of the four first light emitting elements in the first region is smaller than a distance between the first region and the second region, and wherein the first color is red, the second color is green, the third color is blue and the fourth color is red-purple or yellow-orange.

10. The display device according to claim 9, wherein the third region is arranged in a same column as one of the first and second regions.

11. A display device comprising a plurality of light emitting elements having different luminescent colors, the device comprising:

a first group including four first light emitting elements which emit a first color with the first light emitting elements arranged in two rows and in two columns;

a second group including four second light emitting elements which emit a second color with the second light emitting elements arranged in two rows and in two columns;

a third group including four third light emitting elements which emit a third color with the third light emitting elements arranged in two rows and in two columns;

a fourth group including four fourth light emitting elements which emit a fourth color with the fourth light emitting elements arranged in two rows and in two columns;

wherein the first group, the second group, the third group and the fourth group are arranged in rows and columns of two groups each, and wherein the first color is red, the second color is green, the third color is blue and the fourth color is red-purple or yellow-orange.

12. The display device according to claim 11, wherein the first light emitting elements emit a color having coordinates in the region where x in a chromaticity diagram is 0.6 or more, and y is 0.35 or less, when the color is indicated by a CIE-XYZ color system;

wherein the second light emitting elements emit a color having coordinates in the region where x in a chromaticity diagram is 0.3 or less, and y is 0.6 or more, when the color is indicated by a CIE-XYZ color system;

wherein the third light emitting elements emit a color having coordinates in the region where x in a chromaticity diagram is 0.15 or less, and y is 0.2 or less, when the color is indicated by a CIE-XYZ color system; and wherein the fourth light emitting elements emit a color having coordinates in the region where x in a chromaticity diagram is 0.15 or less, and y is 0.25 or more and 0.5 or less, when the color is indicated by a CIE-XYZ color system.

* * * * *